United States Patent
Dasgupta et al.

(10) Patent No.: US 9,859,121 B2
(45) Date of Patent: Jan. 2, 2018

(54) MULTIPLE NANOSECOND LASER PULSE ANNEAL PROCESSES AND RESULTANT SEMICONDUCTOR STRUCTURE

(71) Applicant: INTERNATIONAL BUSINESS MACHINES CORPORATION, Armonk, NY (US)

(72) Inventors: Aritra Dasgupta, Wappingers Falls, NY (US); Oleg Gluschenkov, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 43 days.

(21) Appl. No.: 14/753,954

(22) Filed: Jun. 29, 2015

(65) Prior Publication Data
US 2016/0379830 A1   Dec. 29, 2016

(51) Int. Cl.
*H01L 21/28* (2006.01)
*H01L 21/268* (2006.01)
*H01L 29/51* (2006.01)

(52) U.S. Cl.
CPC ...... *H01L 21/28176* (2013.01); *H01L 21/268* (2013.01); *H01L 29/513* (2013.01); *H01L 29/517* (2013.01)

(58) Field of Classification Search
CPC .............. H01L 21/268; H01L 21/2683; H01L 21/28167; H01L 21/28176; H01L 21/477
See application file for complete search history.

(56) References Cited

U.S. PATENT DOCUMENTS

| | | | | |
|---|---|---|---|---|
| 4,439,245 A | * | 3/1984 | Wu | H01L 21/268 117/8 |
| 6,303,476 B1 | * | 10/2001 | Hawryluk | B23K 26/18 257/E21.324 |
| 6,366,308 B1 | | 4/2002 | Hawryluk et al. | |
| 6,403,981 B1 | * | 6/2002 | Yu | H01L 29/66742 257/616 |
| 6,461,945 B1 | * | 10/2002 | Yu | H01L 21/28211 257/E21.133 |
| 6,780,789 B1 | | 8/2004 | Yu et al. | |
| 6,783,591 B1 | * | 8/2004 | Halliyal | H01L 21/268 117/104 |
| 6,841,441 B2 | | 1/2005 | Ang et al. | |

(Continued)

FOREIGN PATENT DOCUMENTS

WO   WO 0171787 A1 * 9/2001 ........ H01L 21/26513

OTHER PUBLICATIONS

Kuhn et al., "Technology Options for 22nm and Beyond", International Workshop on Junction Technology, May 2010, 6 pages.

(Continued)

*Primary Examiner* — Joshua King
(74) *Attorney, Agent, or Firm* — Steven J. Meyers; Andrew M. Calderon; Roberts Mlotkowski Safran Cole & Calderon, P.C.

(57) ABSTRACT

Semiconductor structures and methods of fabricating the same using multiple nanosecond pulsed laser anneals are provided. The method includes exposing a gate stack formed on a semiconducting material to multiple nanosecond laser pulses at a peak temperature below a melting point of the semiconducting material.

18 Claims, 5 Drawing Sheets

(56) References Cited

U.S. PATENT DOCUMENTS

| | | | |
|---|---|---|---|
| 6,872,643 B1* | 3/2005 | Halliyal | H01L 21/265 257/E21.334 |
| 6,897,118 B1* | 5/2005 | Poon | H01L 29/6659 257/E21.324 |
| 7,078,302 B2 | 7/2006 | Ma et al. | |
| 7,112,499 B2* | 9/2006 | Poon | H01L 21/26506 257/E21.324 |
| 7,786,025 B1 | 8/2010 | Gluschenkov et al. | |
| 7,902,032 B2 | 3/2011 | Jain | |
| 8,309,474 B1* | 11/2012 | Wang | H01L 21/02678 438/166 |
| 8,409,942 B2 | 4/2013 | Scheiper et al. | |
| 2002/0192914 A1* | 12/2002 | Kizilyalli | H01L 21/2257 438/300 |
| 2003/0025167 A1 | 2/2003 | Park et al. | |
| 2005/0258491 A1* | 11/2005 | Bojarczuk, Jr. | H01L 21/28202 257/369 |
| 2006/0148215 A1* | 7/2006 | Zhu | H01L 21/26506 438/482 |
| 2007/0238267 A1* | 10/2007 | Liu | H01L 21/2022 438/478 |
| 2008/0268597 A1 | 10/2008 | Wei et al. | |
| 2010/0006952 A1* | 1/2010 | Ontalus | H01L 21/26586 257/408 |
| 2011/0207328 A1* | 8/2011 | Speakman | H01L 51/0016 438/694 |
| 2012/0280288 A1 | 11/2012 | Ando et al. | |
| 2014/0329340 A1* | 11/2014 | Yokouchi | H01L 21/265 438/10 |

OTHER PUBLICATIONS

Chen et al., "A Novel Method to Improve Laser Anneal Worsened Negative Bias Temperature Instability in 40-nm CMOS Technology", IEEE Transactions on Electron Devices, Mar. 2011, pp. 901-905, vol. 58, No. 3.

Hatta et al., "Laser Anneal-Induced Effects on the NBTI Degradation of Advanced-Process 45nm high-k PMOS", Advanced Materials Research, Feb. 2011, pp. 1862-1867, vols. 189-193.

Cho et al., "Interface/Bulk Trap Recovery After Submelt Laser Anneal and the Impact to the NBTI Reliability", IEEE Electron Device Letters, Jun. 2010, pp. 606-608, vol. 31, No. 6.

List of IBM Patents or Patent Applications Treated as Related 1 page.

Specification "Multiple Nanosecond Laser Pulse Anneal Processes and Resultant Semiconductor Structure" and Drawings in U.S. Appl. No. 15/819,092 filed Nov. 21, 2017, 25 pages.

* cited by examiner

MULTIPLE NANOSECOND LASER PULSE ANNEAL PROCESSES AND RESULTANT SEMICONDUCTOR STRUCTURE

FIELD OF THE INVENTION

The invention relates to semiconductor structures and, more particularly, to semiconductor structures and methods of fabricating the same using multiple nanosecond pulsed laser anneals.

BACKGROUND

In increasing performance of a FET, it is known that gate dielectric reliability vs. Tiny scaling is a major industry trade-off. For example, increasing the thickness of a dielectric material stack increases reliability of the semiconductor device, but this increase in stack thickness will also decrease performance. Conversely, decreasing the thickness of a dielectric material stack can decrease reliability of the semiconductor device, but this decrease in stack thickness will also increase performance.

Also, as MOSFET devices are scaled down to less than 100 nanometers in gate or channel length, highly doped, shallow source and drain extension regions can be employed to achieve high drive current capability. The dopants are activated by conducting laser annealing or other millisecond-scale (mSec) annealing of the implanted extension regions either prior, during, or after a more conventional, second-scale Rapid Thermal Anneal (RTA).

Laser annealing can be characterized by the duration of exposure to its radiation. Pulsed lasers, for example, operate in a nanosecond-range regime with exposure durations of tens to two hundreds of nanoseconds with a typical exposure time of less than one hundred nanoseconds. At such short anneals, thermal activation of dopants can be inefficient. Consequently, the dopant activation process relies on a phase transition such as melting-recrystallization of amorphized and doped semiconductors. Due to this reason, nanosecond-scale laser annealing is also referred to as melt laser annealing or pulsed laser annealing. Nanosecond-scale laser annealing also has a very large temperature pattern effect because the laser energy absorbed in surface microstructures does not have sufficient time to spread uniformly within the substrate via thermal diffusion. In addition to large pattern effects, its reliance on inducing phase transitions in microstructures produces substantially different levels of dopant activation near exposure edges or in areas of exposure overlap.

In contrast, millisecond-scale "mSec" laser annealing has exposure times ranging from tens of microseconds to tens of milliseconds. In this range, thermal activation of dopants can be efficient, and the concentration of active dopants is generally proportional to the peak anneal temperature. Continuous wave lasers are employed in this regime. Since the laser beam is shaped in the form of a line, the wafer surface is raster scanned, which means that it is scanned as a pattern of parallel lines or curves. In this case, the exposure time (also referred to as the dwell time) is equal to the characteristic beam width in the scanning direction (often defined at full width at half maximum (FWHM)) divided by the scan speed. The beam length (e.g., about 10 millimeters (mm)) perpendicular to the scanning direction (often defined at full width at 95-99% of the maximum) is usually much smaller than the wafer size (e.g., about 300 mm). As such, adjacent scans (also referred to as exposures) are often applied with some overlap to completely cover the entire wafer surface. In the overlap region, the wafer surface is exposed and annealed twice.

SUMMARY

In an aspect of the invention, a method comprises exposing a gate stack formed on a semiconducting material to multiple nanosecond laser pulses at a peak temperature below a melting point of the semiconducting material.

In an aspect of the invention, a method comprises forming a transistor on a semiconducting material. The transistor comprises a gate stack composed of high-k dielectric material and gate material. The method further comprises exposing the gate stack to multiple nanosecond laser pulses at a peak temperature below a melting point of the semiconducting material, post gate dielectric deposition.

In an aspect of the invention, a method comprises forming a transistor on a semiconducting material. The transistor comprises a gate stack composed of high-k dielectric material. The method further comprises exposing the gate stack to 10×40 nanosecond pulses at a peak temperature which is below a melting point of the semiconducting material, post gate dielectric deposition.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
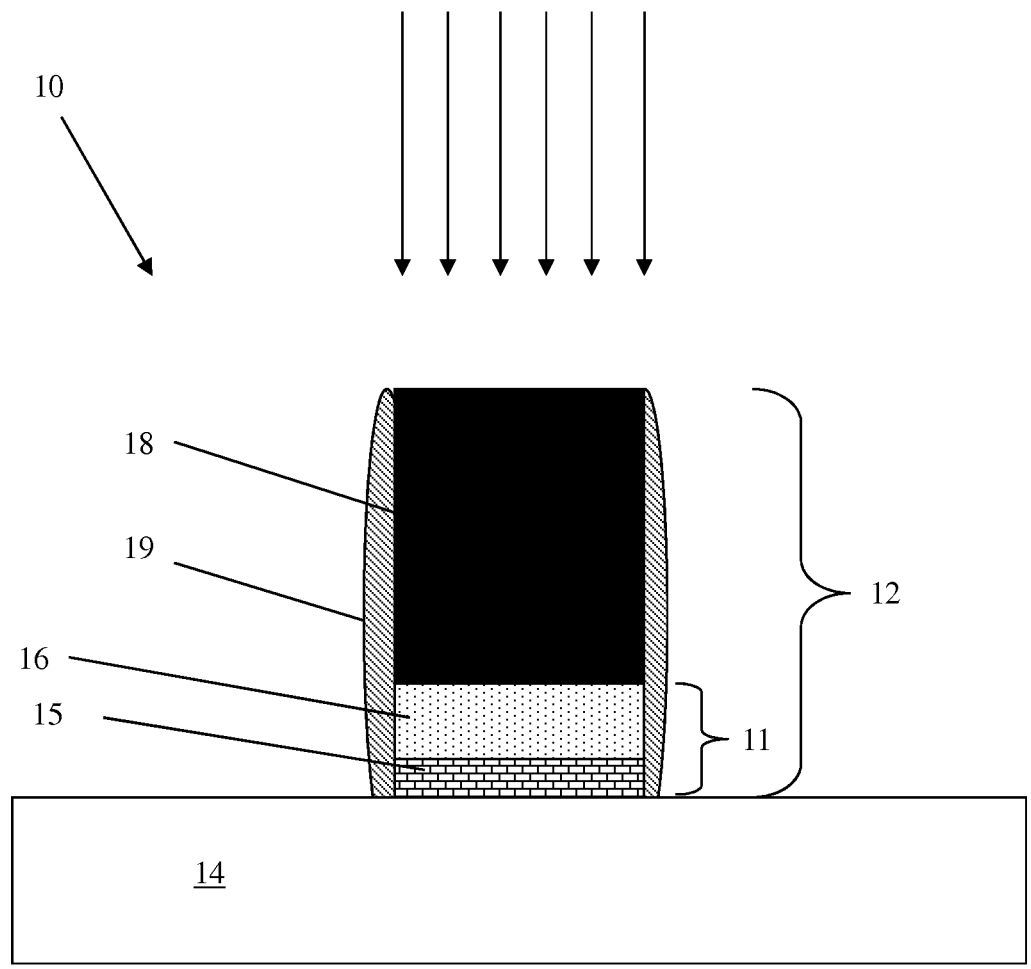
FIG. 1 shows a representative transistor (FET) in accordance with aspects of the invention.

The invention relates to semiconductor structures and, more particularly, to semiconductor structures and methods of fabricating the same using multiple nanosecond pulsed laser anneals. More specifically, the processes described herein provide significant improvement of negative-bias temperature instability (NBTI) in a semiconductor structure using multiple nanosecond pulsed laser anneals of a high-k stack of a gate structure.

In embodiments, the nanosecond pulsed laser anneals described herein comprises multiple laser pulses in the nanosecond range, of a high-k material or stack of materials including a high-k material, at peak temperatures below the melting point of the semiconducting material. In more specific embodiments, the multiple nanosecond pulsed laser anneals have a peak temperature below the melting point of the semiconducting material in the range from about 800° C. to about 1400° C., with a laser pulse duration of 10-100 nSec, ranging from 2 to 100 pulses and more preferably 5 to 100 pulses, for example. In embodiments, the cumulative laser exposure time preferably ranges from 300 nanoseconds to 3 microseconds. In embodiments, the multiple nanosecond pulsed laser anneals can be performed post gate deposition due to the peak temperature being below the melting point of both semiconducting and gate materials.

Advantageously and unexpectedly, the inventors observed that by performing the multiple pulsed laser anneals described herein it is possible to achieve a significant improvement in NBTI on the order of approximately 200 mV of maximum gate voltage using Voltage-Ramp-Stress (VRS) NBTI measurement method. In embodiments, the superior improvement in NBTI, e.g., approximately 200 mV of maximum gate voltage, was achieved using, e.g., a 10× nSec anneal; although other parameters as described herein will also achieve these superior and unexpected results. It was also unexpectedly found by the inventors that NBTI improvement scales with the number of nSec laser anneal pulses or cumulative nSec laser exposure time; something that is counterintuitive and unexpected taking into consideration that a single submelt nSec anneal should technically have no significant, if any, effect on dielectric material properties, e.g., crystallinity and thickness of the dielectric. In further embodiments, no significant changes in nFET parameters including positive bias temperature instability (PBTI), mobility and equivalent oxide thickness were exhibited using the multiple pulsed laser anneals described herein.

Performance of a semiconductor device typically has an inverse relationship to reliability. There are several ways to affect performance and reliability of a semiconductor device. For example, increasing the thickness of a dielectric material stack increases reliability of the semiconductor device, but this increase in stack thickness will also decrease performance. Conversely, decreasing the thickness of a dielectric material stack can decrease reliability of the semiconductor device, but this decrease in stack thickness will also increase performance.

Additionally, performance can be increased using different dielectric materials such as high-k dielectrics or different gate stack metals or materials. The effect of introducing high-k dielectrics is equivalent to thinning down gate dielectric equivalent "electrical" thickness at its given physical thickness. But, different dielectric materials will result in different magnitudes of their internal electric fields under a constant external bias that will lead to different values of their time-dependent dielectric breakdown (TDDB), which is a failure mechanism in FETs when the gate oxide breaks down as a result of long-time application of relatively low electric field. The breakdown is caused by formation of a conducting path through the gate oxide to substrate due to a slow degradation of its insulating property, when FETs are operated close to or beyond their specified operating voltages. Although ultrathin dielectric stacks typically have greater performance parameters, they also typically undergo a catastrophic breakdown compared to thicker dielectric stacks, thus affecting overall reliability.

While TDDB is an example of catastrophic failure, bias temperature instabilities (BTIs) of transistor gates are examples of continuous degradation in transistor performance during its normal operation. During normal product operation, an nFET gate is biased positively with respect to its body causing positive BTI or PBTI, while a pFET gate is biased negatively causing negative BTI or NBTI. Both BTIs are caused by a slow modification of gate dielectric material properties while under electrical bias. Modified gate dielectric properties affect transistor threshold voltage and, consequently, its performance. While the speed of BTI degradation has a typical inverse relationship to the gate dielectric thickness, it is also affected by the choice of gate materials and fabrication processes. As should be understood by those of skill in the art, BTI's are dielectric material properties which relate to the quality of interfaces and bulk dielectric materials. Accordingly, NBTI and PBTI metrics adjusted for the gate dielectric thickness can be viewed as material properties of respective pFET and nFET gate stacks quantifying their resistance to modifications under electrical bias.

There are several test methods to assess the speed of BTI degradation. These test methods lead to different metrics that will be briefly discussed here. One such test method is referred to as a Constant Voltage Stress (CVS) test and another method is known as a Voltage Ramp Stress (VRS) test. BTI tests are conducted at an elevated temperature of 125° C. to speed up degradation effects. In the CVS method, a constant voltage Vg is applied on the gate terminal of a transistor for duration that increases on a logarithmic scale. The corresponding Vt shift, $\Delta$Vt, is measured as a function of stress time. The result is written in terms of time (relates to the transistor lifespan) during which the threshold voltage shifts by a certain preset value. In this form, the result is greatly affected by the chosen stress gate voltage. A higher gate voltage results in shorter transistor lifespan. CVS test is typically conducted at an elevated gate bias to shorten the stress time and then projected to the transistor operating voltage using statistical methods of accelerated testing. In contrast, in the VRS method, a ramped stress voltage with a certain ramp rate is applied to the gate terminal and the threshold voltage is assessed continuously during the test. As the gate voltage ramps, the threshold voltage shift is measured. The result of this test is generally written in terms of maximum gate voltage (relates to the maximum operating voltage) at which the threshold voltage shifts by a certain preset value, typically, 50 mV. The higher the gate voltage, Vg, for the set threshold voltage shift, $\Delta$Vt, of 50 mV, the more reliable the gate stack in terms of respective BTI's. Under assumptions of accelerated testing, both the VRS and CVS test methods are shown to be equivalent but converting different BTI reliability metrics requires the use of sophisticated accelerated testing models.

Different process conditions can also affect performance and reliability of the semiconductor device since they affect material properties of the dielectric gate stacks. The dielectric layers are initially formed or deposited as an amorphous laminate. Various chemical and thermal post-treatments are applied to reduce dielectric stack equivalent electrical thickness and to improve the quality of materials. In addition, the gate stack may be subjected to additional thermal post-treatments that are directed to enabling other process modules such as dopant activation, stress engineering, silicidation, interconnects, and others. Thermal post-treatments are characterized by their duration and ramp up/down rates. A number of investigators and practitioners assessed the effect of shortening thermal post-treatments from second-scale, slow cool down (<100° C./sec) Rapid Thermal Annealing or Spike Annealing to millisecond-scale, fast quench (>1e5° C./sec) Laser Annealing or Laser Spike Annealing onto NBTI reliability and found that the application of millisecond laser annealing degrades NBTI reliability and requires a method for its recovery. See, e.g., Cho et al., Interface/Bulk Trap Recovery After Submelt Laser Anneal and the Impact to NBTI Reliability. It has been observed that an application of millisecond-scale laser spike annealing will result in creating bulk and interfacial traps within SiOx/HfSiO/AlO/TiN high-k, metal gate pMOS stack and degraded NBTI reliability. It has been further observed that an application of longer, second-scale RTA after the millisecond anneal partially heals generated traps and recovers NBTI reliability. It has been suggested that a longer RTA post-treatment allows enough time for healing dielectric defects generated during high-temperature laser annealing and preserved by its fast cool down rate or quenching. See, e.g., Chen et al., A Novel Method to Improve Laser Anneal Worsened Negative Bias Temperature Instability in 40-nm CMOS Technology, IEEE Transactions on Electron Devices, Vol. 38, No. 3, March 2011. Similar to Cho et al., it has been shown that the application of millisecond-scale laser or flash-lamp annealing results in a degraded NBTI of SiON/PolySi pMOS gate stack. It has been further observed that an application of a second-scale RTA after the millisecond anneal partially recovers NBTI reliability. Moreover, in F. Wan Muhamad Hatta et al., Laser Anneal-Induced Effects on the NBTI Degradation of Advanced-Process 45 nm high-k PMOS, Advanced Materials Research Vols. 189-193 (2011) pp 1862-1866, NBTI reliability degradation was observed subsequent to the integration of millisecond-scale laser annealing (LA) in the process flow of a SiOx/HfO$_2$/TiN gate stack PMOS device. Clearly, short-duration, high-temperature anneals with a fast cool down or quenching are found and believed to be detrimental to NBTI reliability irrespective of specific dielectric layers employed within pMOS gate stacks.

Thermal post-treatments of high-k dielectric stacks may also induce crystallization of amorphous high-k layers. The crystallization threshold temperature depends on specific high-k materials used in the stack and is about 800-850° C. for the ultrathin (<3 nm) hafnium oxide layers and is about 400-500° C. for similar zirconium oxide layers, for instance. The size of crystallites also depends on speed and duration of crystallizing anneals: generally, smaller crystallites are produced by shorter, faster anneals. Consequently, the observable crystallization temperature for millisecond anneals is about 200-300° C. higher than the crystallization threshold temperature measured using isothermal annealing with long durations. Typical size of crystallites produced by millisecond-scale anneals is found to be around 1.5-2 nm with a mixture of monoclinic and tetragonal phases co-existing within ultrathin HfO$_2$ films. In order to distinguish between different crystallization threshold temperatures and resultant crystallite sizes, the crystallization induced by millisecond anneals will be referred to as micro-crystallization. Crystallizing anneals are known to improve BTI reliability parameters of the stacks when compared to anneals which preserve amorphous layers. However, crystallization of high-k layers also results in multiple detrimental side effects. Crystallization releases excess oxygen atoms from the high-k film causing growth or thickening of the low-k interfacial layer. Further, the crystalline high-k material has a higher speed of diffusion for oxygen atoms and oxygen vacancies allowing for their transport from transistor exterior to its channel region where they affects threshold voltage and uniformity of the interfacial layer. Crystallization of high-k material may also retard the diffusion of useful additive metallic atoms such La or Mg that are often employed for producing multiple threshold voltage transistors. This, in turn, suppresses the freedom of adjusting threshold voltage of select transistors. In addition, crystallization of high-k material causes surface roughness and material property variation between crystalline grains, which, in turn, results in non-uniform electrical fields in the channel region adjacent the dielectric film. This, in turn, significantly degrades device performance. In general, the crystallization of high-k films in gate stacks is either avoided altogether or postponed until later in the process sequence when high-k layers are sealed mitigating detrimental effects caused by re-crystallization.

Nanosecond (nSec) laser anneal (e.g., 10's to 100 nSec temperature pulses) has been employed to locally melt materials (e.g., Si, SiGe, Ge, silicides, metal interconnects) to enable forming metastable alloys by quenching the molten phase. To melt materials, the nSec laser pulse anneal is performed above the melting point of the selected material, e.g. an underlying semiconductor. Although a duration of nSec treatment is known to prevent any collective motion of atoms in the solid state (e.g., no dislocation formation, no re-crystallization, no grain growth, etc.), nonetheless it has been found that submelt nSec laser anneal may induce random motion of atoms in the solid phase such as creation of point defects and modifying nearest-neighbor bonding arrangements. A super fast cool down rate in excess of 1e8° C./sec freezes any changes induced by nSec melt or sub-melt laser annealing. Accordingly, it has been believed that a transition to a molten high-k phase would be required in order to induce high-k layer re-crystallization possibly positively affecting BTI parameters. Attaining melting point of hafnium oxide high-k material of about 2750° C. would not be of any practical interest due to simultaneous melting and/or evaporating underlying semiconducting materials with much lower melting points, e.g. melting silicon with its melting point of 1410° C. Further, the fast cool down rate or quenching would suggest a possible negative impact on BTI reliability parameters and, more specifically, onto NBTI reliability parameters. Clearly based on the above observed properties using a nanosecond pulsed anneal process, it would not have been expected that significant improvement in NBTI would occur with any number of nanosecond anneal pulses, but the fact that the processes of the present invention as described herein did possess such significant property improvement was an unexpected result to the inventors.

FIG. 1 shows representative transistor elements in accordance with aspects of the invention. As shown in this representative figure, the structure 10 includes principle elements of a transistor formed on a semiconductor material 14. The semiconductor material 14 can be composed of any suitable material including, but not limited to, Si, SiGe, SiGeC, SiC, Ge alloys, GaAs, InAs, InP, and other III/V or II/VI compound semiconductors. The semiconductor material 14 is lightly doped having doping polarity opposite to the FET type, e.g. a lightly doped n-type semiconducting material for pFET. The structure 10 includes a gate stack 12 formed on the semiconductor material 14, and includes a high-k dielectric stack 11 composed of one or more layers of interfacial dielectric 15 and one or more layers of high-k dielectric material 16 including, for example, hafnium oxide materials. In embodiments, the interfacial dielectric can be SiO$_2$ or SiO$_x$N$_y$, as examples. The gate stack 12 can further include conductive gate material 18 formed on the high-k dielectric stack 11. In embodiments, the gate material 18 can include, e.g., doped polycrystalline semiconducting material or different layers of metallic materials depending on the desired work function and performance parameters. The gate stack 12 can further include sidewall isolation structures 19, e.g., nitride based dielectric material. The transistor structure 10 can further include doped source and drain structures and metallic contacts that are not shown. The source and drain structures are doped oppositely to the transistor body 14, e.g. p-type doped for the n-type pFET body. While the semiconductor material 14 is drawn as a horizontal slab, the structure 10 is equally representative of various three-dimensional transistors where the material 14 may be oriented differently and/or may have a different shape. Such three-dimensional, non-planar transistors include finFETs, surround-gate FETs, multiple-gate FETs, nano-wire or nano-sheet FETs, vertical FETs, and others.

The structure 10 shown in FIG. 1 can be manufactured in a number of ways using a number of different tools. In general, though, the methodologies and tools are used to form structures with dimensions in the micrometer and nanometer scale. The methodologies, i.e., technologies, employed to manufacture the structure 10 have been adopted from integrated circuit (IC) technology. For example, the structures of the present invention are built on wafers and are realized in films of material patterned by photolithographic processes on the top of a wafer. In particular, the fabrication of the structure 10 uses three basic building blocks: (i) deposition of thin films of material on a substrate, (ii) applying a patterned mask on top of the films by photolithographic imaging, and (iii) etching the films selectively to the mask. In addition to these basic steps, chemical mechanical polishing, ion implantation, and annealing processing steps can be employed. Various elements of structure 10 can also be formed using different sequential order. For instance, the gate stack 12 can be formed first followed by the spacers 19, or alternatively, the spacers 19 can be formed first followed by gate stack 12. The latter approach is known as the replacement gate sequence while the former is known as the gate first sequence.

Figure 2:
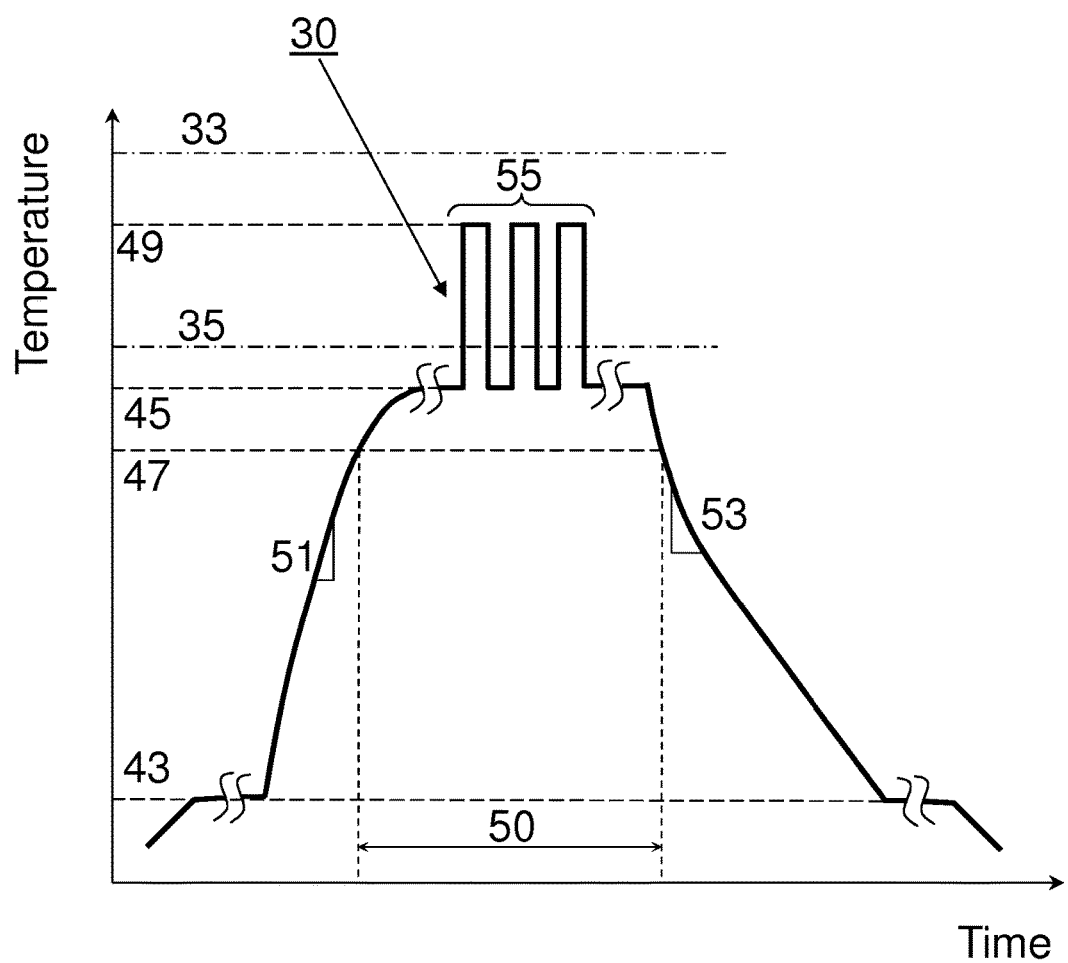
FIG. 2 shows a representative temperature-time trace of the nSec laser anneal process in accordance with the present invention.

In accordance with aspects of the present invention, the gate dielectric stack 11 of structure 10 also undergoes a nanosecond laser anneal process as represented by the arrows in FIG. 1, which significantly improves NBTI reliability of pFET gate stack. FIG. 2 shows a representative temperature-time trace 30 of the nSec laser anneal process in accordance with the present invention. Temperature-related features of the trace 30 include the substrate preheat level 43, millisecond preheat level 45, level 47 at which millisecond preheat duration is measured, and peak nanosecond level 49. The level 47 is typically referenced to level 45, e.g. 100° C. below it. Duration-related features of the trace 30 include millisecond preheat characteristics: duration 50, heat up rate 51, cool and down rate 53; and multiple nanosecond temperature pulses 55. The nanosecond temperature pulses 55 are characterized by the number of pulses and individual pulse duration, heat up and cool down rates. While the duration of an individual temperature pulse is directly related to the nanosecond exposure time, they are not equal. The temperature pulse is typically measured at about 100° C. below the peak temperature and is about 2-4 times shorter than the exposure time that is measured at full width at half maximum (FWHM) of incident laser power density. The specifications are often made easier in terms of exposure time rather than temperature pulse durations since the exposure time is directly controlled during processing. The nanosecond annealing portion of temperature trace can be also characterized by the cumulative nanosecond exposure time defined as the sum of individual nanosecond pulse exposure durations. FIG. 2 also shows two temperature limits: crystallization limit 35 and melt limit 33. These limits depend on the choice of semiconductor material 14 and high-k material 16 and nSec laser anneal position in processing flow sequence.

In accordance with the present invention, the nSec laser anneal can be conducted at various steps after forming dielectric stack 11 but prior to any high-k crystallizing anneals. In some embodiments, the nSec anneal is performed immediately after forming stack 11. In this case, the melt limit 33 is defined by the melting point of semiconductor material 14. If material 14 is a compound semiconductor material such as SiGe or III-V compounds, then the melting point for limit 33 is given by the liquidus temperature of material 14. The crystallization limit 35 is given by the micro-crystallization threshold of high-k material 16. A preferred range for peak temperature of nSec laser anneal (level 49) is from above the micro-crystallization limit 35 and below the melt limit 33 while a more preferred range is from about 200° C. below the melt limit 33 to about 50° C. below the melt limit 33. While the millisecond-scale preheat is not required, it is highly preferred due to reduced requirements on nSec temperature swing, needed nSec laser power density, and associated reduction of nSec pattern effects. Accordingly, higher millisecond preheat temperature is desired but it can induce unwanted high-k micro-crystallization. Hence, the preferred range for the millisecond preheat temperature (level 45) is from about 300° C. below the micro-crystallization limit 35 to about 50° C. below the micro-crystallization limit 35. The preferred duration 50 of millisecond preheat is from about 0.1 msec to about 5 msec. Preferred range of heat up 51 and cool down 53 rates is from about 1e4 to about 1e6° C./sec. Typical substrate base temperature (level 43) is from the room temperature to about 500° C. with 150° C. to 300° C. being preferred. In alternative embodiments, the nSec laser anneal is performed after some or all elements of conductive structure 18 are formed but prior to any high-k crystallizing anneals. In this case, the melt limit 33 is the lower of melting points of semiconducting material 14 and conductive materials of structure 18. Typical metallic/conductive elements of structure 18 include refractory metals, metal nitrides and carbides such as W, Co, Ti, Ta, TiN, TaN, TiC, and TaC, all of which have melting points substantially higher than the semiconducting material 14 and, hence, do not affect the melt threshold 33 and the preferred range of peak nSec laser anneal temperature 49. More importantly, presence of conductive elements of structure 18 may put a lower limit onto millisecond preheat temperature 45 due to a damage to the metal gate at high-temperature for millisecond duration. In this case, the millisecond preheat temperature is kept preferably below 800° C. and more preferably below 700° C.

In view of the many studies performed, as noted above, it was unexpected to the inventors that multiple nanosecond laser anneal temperature pulses would result in significant improvement in NBTI, e.g., on the order of 200 mV for "Voltage-to-50 mV" metric of VRS test, particularly in view of Cho, et al., Chen, et al., and Hatta et al. For example, due to the ultra short pulses, it was expected that either no change or a degradation of reliability parameters would occur when performing multiple nanosecond pulsed laser anneals in accordance with the present invention, e.g., nanosecond anneals with peak temperature below the melting point of both semiconducting and high-k materials; instead, such processes provided a significant improvement in NBTI reliability. Also, due to the ultra short anneal duration of the pulsed nanosecond anneal, the dielectric material of the semiconductor device does not exhibit any micro-crystallization, nor is there any re-crystallization of other materials due to the peak temperature of the anneal being below the respective melting points of these other materials.

More specifically, TABLE 1 shows pFET cells which were subjected to different anneal process sequences, post dielectric stack deposition. In this case, the semiconducting material was silicon with the melting point of 1412° C., e.g., about 1400° C. Interfacial layer, "IL", was a thin (<1 nm)

SiON layer and high-k layer was a ~2 nm-thick $HfO_2$. The $HfO_2$ crystallization threshold was about 850° C. while a micro-crystallization threshold was about 1050° C.-1100° C. As shown in TABLE 1, pFET wafers in Group I cells were subjected to a micro-crystallizing millisecond anneal at ~1200° C. peak temperature and ~0.5 msec duration at 1100° C.; whereas, pFET wafers in Group II and III were subjected to a single (1×) nanosecond laser pulse anneal process with varying nanosecond peak and millisecond preheat temperatures. pFET wafers in Group IV, on the other hand, were subjected to multiple (10×) nanosecond (e.g., ~40 nanoseconds exposure time) pulsed laser anneals at a peak temperature of ~1300° C., in accordance with aspects of the invention. Accordingly, the cumulative nanosecond exposure time for the Group IV was about 400 nanoseconds and about 40 nanoseconds for groups II and III. All cells also had an additional RTA anneal at about 1000° C. peak conducted during deposition of conductive gate 18.

TABLE 1

| Group | Anneal sequence type | mSec anneal, Level 45 of FIG. 2 | nSec anneal, Level 49 of FIG. 2 | Additional mSec anneal, peak temp | NBTI |
|---|---|---|---|---|---|
| Group I | msec | none | none | 1200 C. | Reference cell (ref) |
| Group II | msec + nanosec | | | | |
| (i) | msec + nanosec I | 800 C. | 1300 C. | | same as ref. |
| (ii) | msec + nanosec II | 900 C. | 1200 C. | | same as ref. |
| Group III | msec + nanosec + msec | 900 C. | 1300 C. | 1200 C. | same as ref. |
| Group IV | msec + multiple nanosec | 900 C. | multiple (10) nanosec pulses at 1300 C. | | 200 mV improvement over ref. cell |

Figure 3:
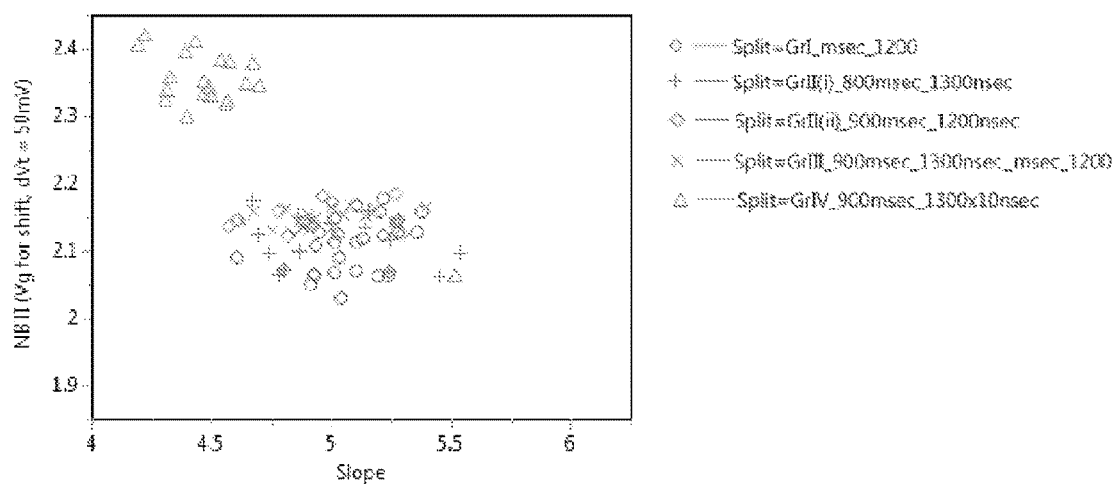
FIG. 3 shows a reliability graph of NBTI using pFET cells shown in TABLE 1.

FIG. 3 shows a reliability graph of NBTI, comparing pFET cells shown in TABLE 1. The x-axis of the graph represents slope of the statistical distribution and the y-axis represents gate voltage (V) to induce a 50 mV threshold voltage shift. The triangles "Δ" represent the pFET cells in Group IV (e.g., pFET cells subjected to multiple (10×) nanosecond (e.g., 20-40 nanoseconds) pulsed laser anneals at a peak temperature of 1300° C.) and millisecond preheat of 900 C; whereas the circles "○" represent pFET cells in Group I (the reference cell), the pluses "+" represent pFET cells in Group II(i), the diamonds "◊" represent pFET cells in Group II(ii), the crosses "×" represent pFET cells in Group III.

As shown in FIG. 3, the pFET cells in Groups I, II and III are mainly distributed between 2.10 V and 2.18 V. However and surprising to the inventors, the pFET cells in Group IV are mainly distributed between 2.28 V and 2.43 V, which is a significant improvement over the other pFET cells. Accordingly, FIG. 3 shows the superior improvements attained by implementing the processes of the present invention. Here, the unexpected results show a demonstration of a marked improvement of the properties, over the results achieved under other process conditions, such that this cannot be classified simply as one of degree alone. Also, these results are of such significance that they provide a practical advantage by significantly increasing NBTI, i.e., superiority in a property of the material stack, which was not observed by the known processes.

Figure 4:
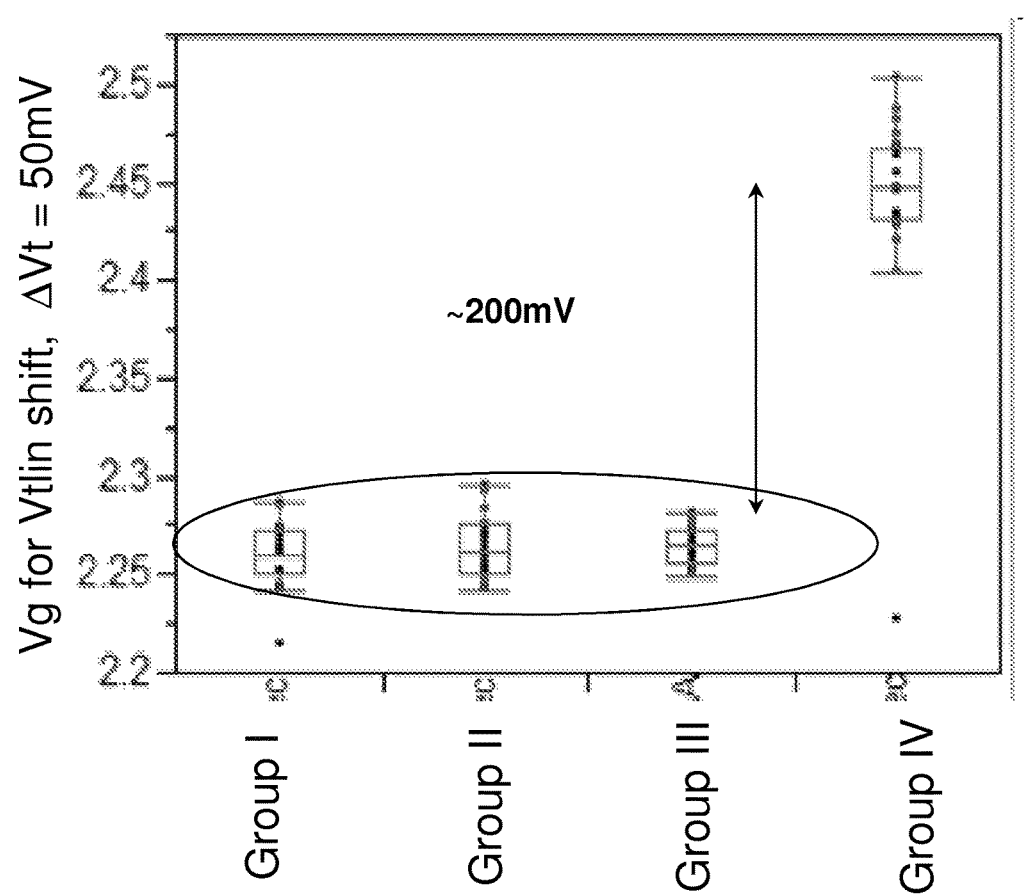
FIG. 4 shows another reliability graph of NBTI using the pFET cells shown in TABLE 1.

FIG. 4 shows another reliability graph of NBTI, comparing pFET cells shown in TABLE 1. The x-axis of the graph represents pFET cells subjected to different annealing processes; whereas the y-axis represents gate voltage (V) to induce a 50 mV threshold voltage shift. In this graph, the grouping of pFET cells is the same as in TABLE 1

Here, again, it is shown that a significant improvement in NBTI is achieved in the pFET cells in Group IV which were subjected to the annealing processes of the present invention. More specifically, as shown in FIG. 4, the NBTI improved by ~200 mV for pFET cells subjected to the annealing process of Group IV, which designates a 900° C. mSec preheat with ten (10×) ~40 nanosecond exposure time pulses with ~1300° C. peak temperature; compared to pFET cells subjected to the annealing processes of Groups I, II, and III.

Gate dielectric capacitance in inversion was also measured. All cells had similar statistical distribution of the gate capacitance. The gate capacitance is typically normalized to the silicon oxide dielectric permittivity and expressed in Angstroms of the equivalent silicon oxide, Tinv. When normalized in such way and without any quantum-mechanical corrections, all cells yielded equivalent thickness in inversion of 13+/−0.1 A. Hence, the observed improvement in NBTI shown FIGS. 3 and 4 was achieved without increasing Tiny in accordance with aspects of the invention.

Figure 5:
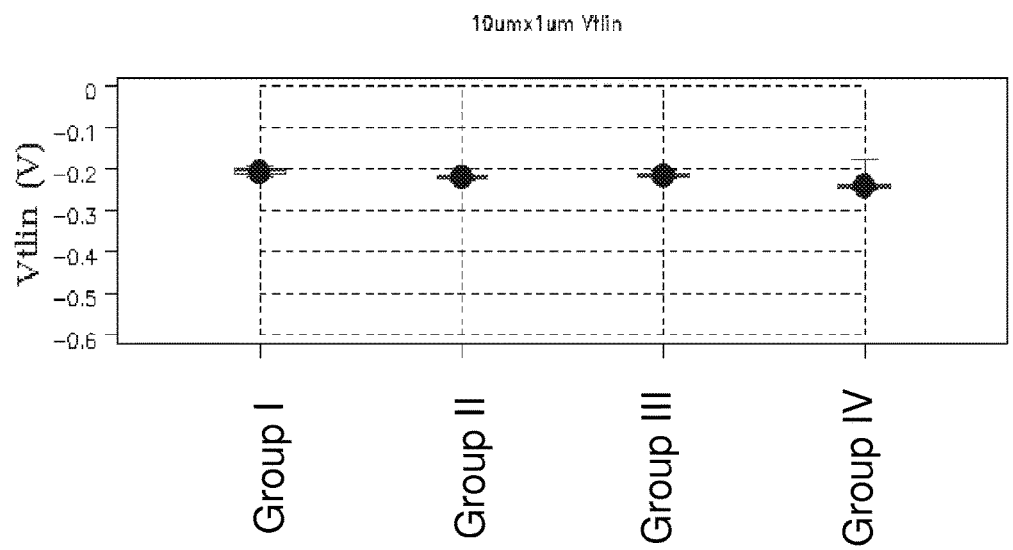
FIG. 5 shows a comparison graph of threshold voltage, Vt, using the pFET cells shown in TABLE 1.

FIG. 5 shows a graph of pFET linear threshold voltage for a large, 10 um-wide and 1 um-gate-length transistors, Vtlin, comparing pFET cells shown in TABLE 1. The x-axis of the graph represents pFET cells subjected to different annealing processes defined in TABLE 1; whereas the y-axis represents Vtlin (V). In this graph, it is shown that there are no significant changes in Vtlin amongst the different cells while the Group IV shows a 40 mV increase of the absolute value of the pFET linear threshold voltage. While the observed shift in threshold voltage will have a small impact on selecting specific transistor operating points, because it can be adjusted by changing workfunction of the gate electrode material, it, nevertheless, points to a change in material characteristics of gate dielectric material when subjected to multiple (10×) nanosecond (e.g., ~40 nanosecond exposures) pulsed laser anneals at a peak temperature of ~1300° C., in accordance with aspects of the invention. Specifically, the shift of 40 mV is equivalent to a change in dielectric fixed charge or charged trap density of ~1e-7 $Coulomb/cm^2$ or ~7e11 $\#/cm^2$, respectively. The sign of threshold voltage shifts indicates either a reduction in negative charge or negatively charged traps or an increase in positive charge or positively charged traps. This represents an unusual material behavior in the context of significant improvements in NBTI that is typically associated with the reduction of positively charged traps.

Figure 6:
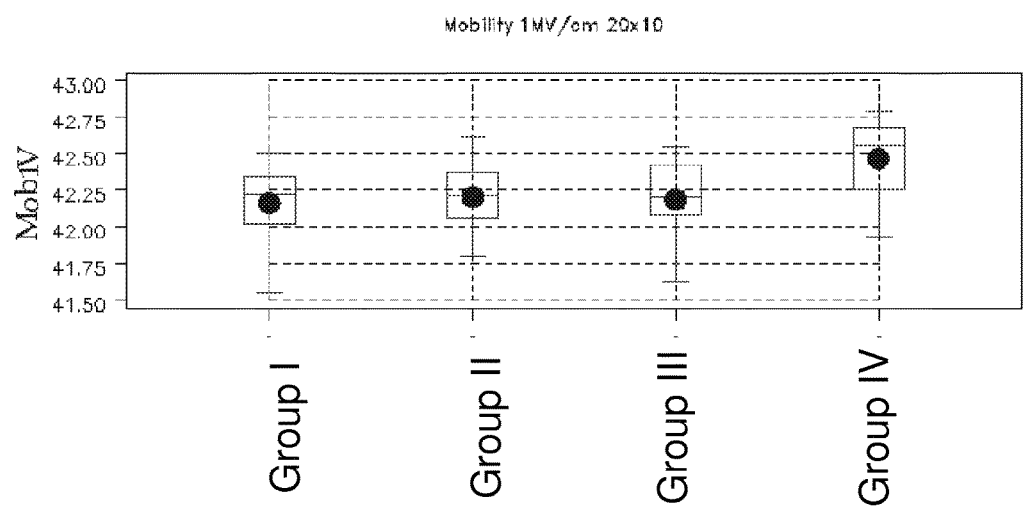
FIG. 6 shows a comparison graph of mobility using the pFET cells shown in TABLE 1.

FIG. 6 shows a graph of mobility at 1 MV/cm E-field, comparing the pFET cells shown in TABLE 1. The x-axis of the graph represents pFET cells subjected to different annealing processes defined in TABLE 1; whereas the y-axis represents mobility of holes in the FET channels. This graph shows that there is no significant degradation in mobility of amongst the different cells.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   forming a gate stack comprising an interfacial dielectric material on a semiconducting material and a high-k dielectric material on the interfacial dielectric material;
   exposing the gate stack to multiple nanosecond laser pulses at a peak temperature, wherein the peak temperature is below a melting point of the semiconducting material and above a micro-crystallization threshold temperature of the high-k dielectric material; and
   further comprising preheating the gate stack to a millisecond preheat temperature, wherein the preheating is performed prior to the exposing the gate stack to the multiple nanosecond laser pulses, and the millisecond preheat temperature is in a range of 300° C. to 50° C. below the micro-crystallization threshold temperature of the high-k dielectric material.

2. The method of claim 1, wherein the multiple nanosecond laser pulses comprises 5-100 pulses.

3. The method of claim 2, wherein a single pulse duration of the multiple nanosecond laser pulses comprises 10-100 nanoseconds.

4. The method of claim 1, wherein a cumulative laser exposure time ranges from 300 nanoseconds to 3 microseconds.

5. The method of claim 4, wherein the multiple nanosecond laser pulses are performed post gate dielectric deposition.

6. The method of claim 1, wherein the semiconducting material includes III/V or II/VI compound semiconductors.

7. The method of claim 1, wherein the semiconducting material comprises group IV semiconductor materials.

8. The method of claim 7, wherein the semiconducting material comprises Si and a peak temperature range is from 1200° C. to 1400° C.

9. The method of claim 1, wherein the multiple nanosecond laser pulses are provided post gate dielectric deposition.

10. The method of claim 1, wherein the semiconducting material is n-type semiconductor material.

11. The method of claim 1, wherein the multiple nanosecond laser pulses comprises 40-50 nsec exposure time for a single pulse process.

12. The method of claim 1, wherein the exposing the gate stack to the multiple nanosecond laser pulses changes a material characteristic of the high-k dielectric material.

13. A method comprising exposing a gate stack formed on a semiconducting material to multiple nanosecond laser pulses at a peak temperature below a melting point of the semiconducting material, wherein the gate stack comprises at least one high-k dielectric material, and further comprising a millisecond preheat temperature range of about 300° C. below a micro-crystallization limit to about 50° C. below the micro-crystallization limit of high-k dielectric material.

14. A method comprising:
    forming a transistor on a semiconducting material, the transistor comprising a gate stack composed of high-k dielectric material and gate electrode material; and
    exposing the gate stack to multiple nanosecond laser pulses at a peak temperature below a melting point of the semiconducting material,
    wherein a cumulative laser exposure time ranges from 300 nanoseconds to 3 microseconds; and
    further comprising a millisecond preheat temperature range of about 300° C. below a micro-crystallization limit to about 50° C. below the micro-crystallization limit of the high-k dielectric material.

15. The method of claim 14, wherein the multiple nanosecond laser pulses comprises 5 to 100 pulses.

16. The method of claim 15, wherein a single pulse duration of the multiple nanosecond laser pulses comprises 10-100 nanoseconds.

17. The method of claim 14, wherein the gate stack is a pFET gate stack composed of high-k dielectric material.

18. The method of claim 14, wherein the exposing the gate stack to multiple nanosecond laser pulses changes a material characteristic of the high-k dielectric material.

* * * * *